United States Patent [19]
So et al.

[11] Patent Number: 5,773,130
[45] Date of Patent: Jun. 30, 1998

[54] MULTI-COLOR ORGANIC ELECTROLUMINESCENT DEVICE

[75] Inventors: Franky So, Tempe; Song Q. Shi, Phoenix; Thomas B. Harvey, III, Scottsdale, all of Ariz.

[73] Assignee: Motorola, Inc., Schaumburg, Ill.

[21] Appl. No.: 656,955

[22] Filed: Jun. 6, 1996

[51] Int. Cl.$^6$ .................................................... B32B 27/14
[52] U.S. Cl. ......................... 428/195; 428/690; 428/691; 428/917
[58] Field of Search .................................. 428/195, 690, 428/691, 917

[56] References Cited

U.S. PATENT DOCUMENTS

| | | | |
|---|---|---|---|
| 4,945,009 | 7/1990 | Taguchi | 428/690 |
| 4,967,251 | 10/1990 | Tanaka | 428/690 |
| 5,156,924 | 10/1992 | Taniguchi | 428/690 |
| 5,294,869 | 3/1994 | Tang | 428/917 |
| 5,405,709 | 4/1995 | Littman | 428/690 |
| 5,445,899 | 8/1995 | Budzilek | 428/690 |
| 5,478,658 | 12/1995 | Dodabalapur | 428/690 |
| 5,516,577 | 5/1996 | Matsurra | 428/690 |
| 5,554,911 | 9/1996 | Nakayama | 428/690 |

OTHER PUBLICATIONS

Masao Uchida et al., "Color–Variable Light–Emitting Diode Utilizing Conducting Polymer Containing Fluorescent Dye", Jpn. J. Appl. Phys. vol. 32 (1993), pp. L921–L924, Part 2, No. 7A, 1 Jul. 1993.

Akihiko Fujii et al., "Color–Variable Electroluminescent Diode with Single Quantum Well Structure Utilizing 8–Hydroxyquinoline Aluminum and Aromatic Diamine", Jpn. J. Appl. Phys. vol. 34 (1995), pp. L499–L502, Part 2, No. 4B, 15 Apr. 1995.

*Primary Examiner*—Paul R. Michl
*Attorney, Agent, or Firm*—Eugene A. Parsons

[57] ABSTRACT

An organic light emitting device capable of emitting different colors and including a first layer of emissive material designed to emit light of a first color and a second layer of emissive material designed to emit light of a second color. The device is activated to emit light of the first or second colors by causing different current densities to flow through the device such that the emitting zone is positioned in the first light emitting layer, thereby emitting light of a first color, or in the second light emitting layer, thereby emitting light of the second color.

12 Claims, 1 Drawing Sheet

MULTI-COLOR ORGANIC ELECTROLUMINESCENT DEVICE

FIELD OF THE INVENTION

The present invention pertains to organic electroluminescent (EL) devices, and particularly to a multi-color organic EL device.

BACKGROUND OF THE INVENTION

Organic electroluminescent (EL) devices are generally composed of three layers of organic molecules sandwiched between transparent and metallic electrodes, the three layers include an electron transporting layer, an emissive layer and a hole transporting layer. Organic EL devices are attractive owing to low driving voltage and the fact that they are generally simple and relatively easy and inexpensive to fabricate. Because of these advantages organic EL devices have a potential application in full color flat emissive displays.

An organic EL device array for image display applications is composed of a plurality of organic light emitting pixels arranged in rows and columns. To generate a full color display from a thin film electroluminescent array, there are two primary technologies known in the prior art. A full color array can be achieved by constructing three sub-pixels (or three organic EL devices) in one pixel, each sub-pixel is designed to emit red, green or blue light. An alternative full color array makes use of a white emitter as a backlight in conjunction with a color filter array containing pixels patterned into red, green, and blue sub-pixels. The second technology to generate full color has been widely used in color liquid crystal displays.

In a full color organic electroluminescent display, the color filter based technology is generally considered less favorable due to the luminescent efficiency limits of most organic EL devices. However, the red, green, blue sub-pixel technology is complicated and expensive to fabricate.

In search for new methods to achieve a multicolor display, Uchida et al. have fabricated a color-variable organic EL device by sandwiching a layer of conducting polymer (ROPPV-8) doped with a fluorescent dye (Alq) between electrodes of Mg:In and ITO (M. Uchida et al. Jpn. J. Appl. Phys. 32, L921 (1993)). Fujii et al have also reported a color-variable EL device achieved by using a single quantum well structure (A. Fujii et al. Jpn. J. Appl. Phys. 34, L499 (1995)). In both case, EL emissions have two Peaks in the visible region. Depending on the voltage applied, the relative intensity of the two emission peaks varies to cause a color change in the light emission.

It is a purpose of the present invention to provide a new and improved scheme to generate a multicolor organic EL device.

It is another purpose of the present invention to provide a multicolor organic EL device and display which is relatively simple to fabricate.

It is still another purpose of the present invention to provide an organic EL display with color icons which is easy to fabricate.

SUMMARY OF THE INVENTION

The above problems and others are at least partially solved and the above purposes and others are realized in an organic light emitting device including a first conductive layer, a first layer of emissive material with first fluorescent dye molecules distributed therein as fluorescent centers for emitting light of a first color and positioned adjacent the first conductive layer, a second layer of emissive material with second fluorescent dye molecules distributed therein as fluorescent centers for emitting light of a second color, different than the first color and positioned on the first layer of emissive material, and a second conductive layer positioned adjacent the second layer of emissive material. Additional layers of emissive material may be included for additional colors. Also, other additional layers of material may be included between the first and second conductive layers and the first and second layers of emissive material, such as, for example, one or more of a hole injection layer, an electron injection layer, a hole transporting layer, an electron transporting layer, an electron blocking layer, or a hole blocking layer, etc.

The device is activated to emit light of the first or second colors by causing a current flow through the device such that the fluorescent dye in the first layer is activated to emit light of the first color, or causing a different current flow through the device such that the fluorescent dye in the second layer is activated to emit light of the second color.

BRIEF DESCRIPTION OF THE DRAWINGS

Referring to the drawings.

DESCRIPTION OF THE PREFERRED EMBODIMENT

Figure 1:
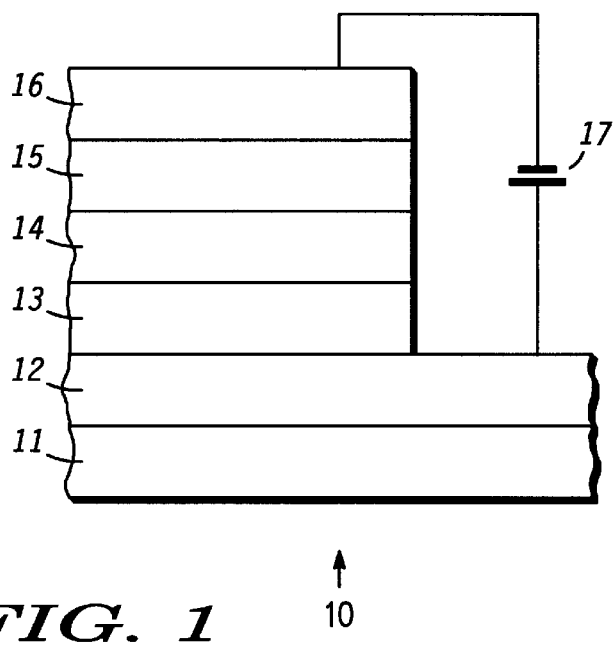
FIG. 1 is a simplified sectional view of an organic light emitting device in accordance with the present invention.

An organic light emitting device (OLED) 10 is illustrated in a simplified cross-sectional view in FIG. 1. Generally, OLED 10 includes a substrate 11 which in this specific embodiment is a glass plate having a relatively planar upper surface. An electrically conductive layer 12 is deposited on the planar surface of substrate 11 so as to form a relatively uniform electrical contact. A first layer 13 made of a hole transporting material is deposited on conductive layer 12. A first light emissive layer 14, which is generally an electron transporting material is positioned on first layer 13. A second light emissive layer 15, which is generally also an electron transporting material is positioned on first light emissive layer 14. As will be explained in more detail presently, first and second light emissive layers 14 and 15 are both light emissive layers. Then a second electrically conductive layer 16 is deposited on the upper surface of second light emissive layer 15 to form a second electrical contact.

While it should be understood that light generated within first and second light emissive layers 14 and 15 can be emitted either through layer 12 and substrate 11 or, alternatively, through layer 16, in the present embodiment conductive layer 12 is formed of organic or inorganic conductors, such as conductive polyaniline (PANI) or indium-tin-oxide (ITO), which are substantially transparent to visible light so that the emitted light exits downwardly through substrate 11 in FIG. 1.

Also, in FIG. 1 OLED 10 has a potential applied between conductive layers 12 and 16 by means of a potential source 17. In this embodiment conductive layer 12 is a p-type contact and conductive layer 16 is an n-type contact. A negative terminal of potential source 17 is connected to conductive layer 16 and a positive terminal is connected to conductive layer 12. Electrons are injected from the n-type contact (conductive layer 16) into second light emissive layer 15 and holes injected from the p-type contact (first conductive layer 12) are transported through first layer 13 and into first light emissive layer 14. In either first emissive layer 14 or second emissive layer 15, upon an electron and a hole recombination, a photon is emitted. First layer 13, made of any hole transporting materials such as poly (phenylene vinylene), tertiary aromatic amine, etc., is used to transport holes from first conductive layer 12 while first and second light emissive layers 14 and 15 serve as electron transporting layers and transport electrons from second conductive layer 16.

It should be emphasized that the active layers, first layer 13 (hole transporting layer) and first and second light emissive layers 14 and 15 in FIG. 1, may be, for example, polymers so that LED 10 can be manufactured inexpensively and have all the other advantage of polymer semiconductor devices. However, as will be understood presently, other organic hole and electron transporting materials can be utilized.

Specifically, first light emissive layer 14 and second light emissive layer 15 are doped with fluorescent dye molecules as fluorescent centers. Further, first light emissive layer 14 is doped with a first fluorescent dye material which, upon activation of layer 14 (combining of holes and electrons therein), causes light of a first color (or frequency) to be emitted. Also, second light emissive layer 15 is doped with a second fluorescent dye material (generally different than the first dye material) which, upon activation of layer 15 (combining of holes and electrons therein), causes light of a second color (or frequency) to be emitted. Generally the second color will be different than the first color. Also, additional light emissive layers can be included in OLED 10 which are doped with fluorescent dye materials of yet different colors. A typical example of the different colors might be red, green, and blue, or any combination of two of these colors.

It has been found through extensive experimentation that activation of either first light emissive layer 14 or second light emissive layer 15, separately, is accomplished by changing the current flow through OLED 10. Generally, a change in the amount of current flow, or the current density, causes the hole-electron recombinations to take place in a different zone in OLED 10. By a careful selection of the light emissive materials, i.e. the bandgaps of the materials and/or band alignments or by doping the materials with different dyes, the emitted colors can be changed. Also, the changes in current required to excite the different materials depends upon a variety of characteristics, including the thicknesses of layers 14 and 15, type of materials, etc. Further, the changes in current can be different driving voltages, different duty cycles, etc.

Figure 2:
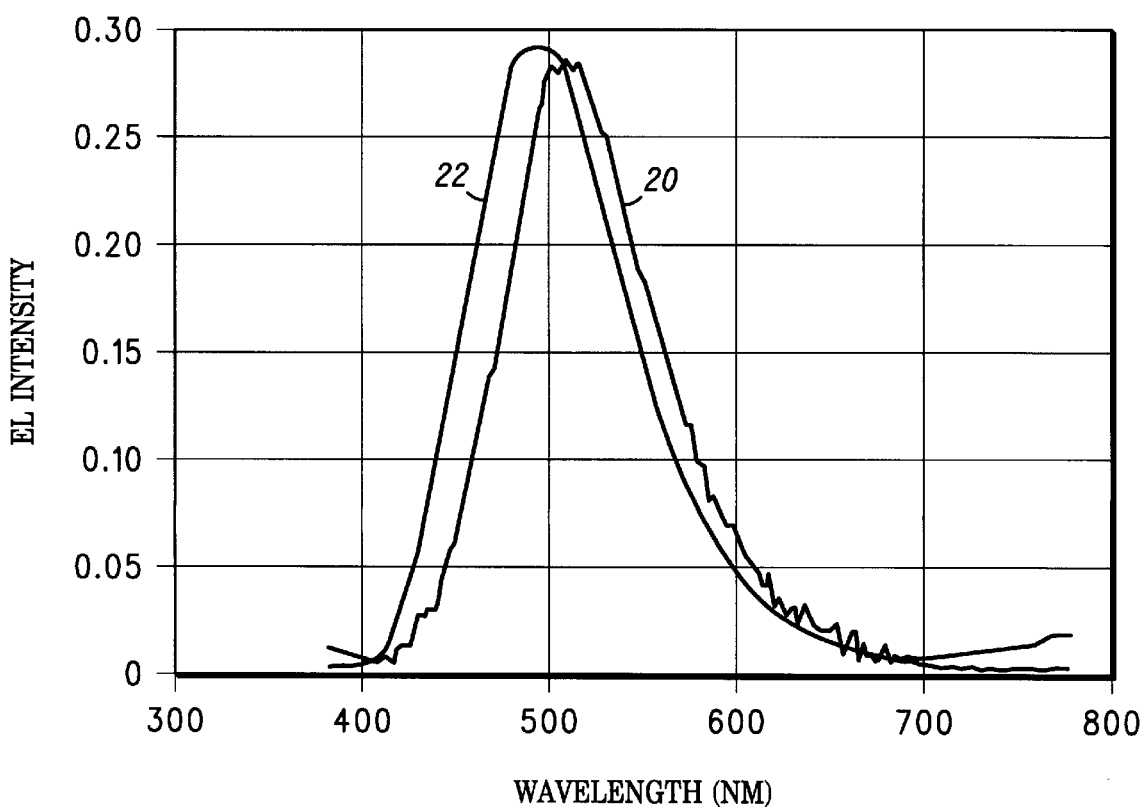
FIG. 2 is a graphical representation of the light output of the organic light emitting device of FIG. 1.

In a specific example illustrated graphically in FIG. 2, an organic EL device is formed as follows: a first layer of 4,4'-bis(3-methylphenylphenylamino)biphenyl (TPD) approximately 700 Å thick is deposited on a transparent conductor, here specifically ITO, on a supporting substrate; a layer of bis(2-(2-oxophenyl)benzoxazole) zinc (Zn(OPB)$_2$) approximately 600 Å thick is deposited on the layer of TPD; and a layer of tris(8-quinolinolato) aluminum (Alq) approximately 200 Å thick is deposited on the layer of Zn(OPB)$_2$. A final conductor, here specifically Mg-Ag alloy, is deposited on the layer of Alq and a power source is attached, generally as illustrated in FIG. 1.

To activate the device of the above specific example to emit different colors, a current of approximately 0.77 mA/cm$^2$ is applied to the opposed conductors. In response to this current the device emits light represented by curve 20 in FIG. 2. When a second current of 615 mA/cm$^2$ is applied to the opposed conductors, the device emits light represented by curve 22 in FIG. 2. As can be seen, the first light emitted has a wavelength of approximately 510 nm while the second light emitted has a wavelength of approximately 490 nm. Further, there is an area between the two peaks where mixtures of the light is present. Thus, the device described is a tunable organic EL device in which the emitting zone is adjustable to alter the color of the emitted light.

An obvious application for this technology is to make a monochrome pixelated organic EL array with icons. That kind of array is popular in portable electronic devices such as cellular phones, personal digital assistants, etc. By varying the driving current, a monochrome display with different icons is obtained. More importantly, colors for both the display and icons can be changed by varying the drive current and duty cycle. Therefore, a color reconfigurable display is obtained. Users can easily reconfigure the color of the display according to their personal likes.

Thus, organic EL device 10 of FIG. 1 is tunable to emit different colors of light under different activating circumstances, such as different current densities, different duty cycles, etc. Also, the different colors are obtained by simply including extra light emitting layers in the structure. Because the inclusion of additional light emitting layers in the structure can be accomplished by one additional step in the manufacturing process, the fabrication is greatly simplified. Further, because each organic EL device is capable of producing multi-color light, the number of I/O pads to an array of the improved organic EL device is reduced by at least one third. Therefore, a new and improved multi-color organic EL device is disclosed which is substantially the same size as previous single color organic EL devices and which is relatively simple to manufacture and to operate and which can be produced in an array with a substantial reduction in area and I/O pads.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A tunable organic light emitting device adjustable to alter a color of light emitted comprising:
   a first conductive layer;
   a first layer of light emissive material for emitting light of a first color when a recombination zone for hole-electron recombinations is positioned therein, the first layer of light emissive material being supported on the first conductive layer;
   a second layer of light emissive material for emitting light of a second color, different than the first color, when the recombination zone for hole-electron recombinations is positioned therein, the second layer of light emissive material being positioned on the first layer of light emissive material;
   a second conductive layer supported on the second layer of light emissive material; and
   a source of current coupled to the first and the second conductive layers to change position of the recombination zone for hole-electron recombinations from the first layer of light emissive material to the second layer of light emissive material, whereby one of the first color is emitted from the first layer or the second color is emitted from the second layer.

2. An organic light emitting device as claimed in claim 1 wherein the first and second layers of light emissive material include fluorescent dye molecules.

3. An organic light emitting device as claimed in claim 2 wherein the fluorescent dye molecules in the first and second layers of light emissive material include at least one of organic, inorganic and organometallic fluorescent dye molecules.

4. An organic light emitting device as claimed in claim 1 wherein one of the first and second conductive layers are transparent to light emitted by the first and second carrier transporting layers.

5. An organic light emitting device as claimed in claim 1 including additional layers of material supported between the first and second conductive layers and the first and second layers of light emissive material.

6. An organic light emitting device as claimed in claim 5 wherein the additional layers of material include one or more of a first carrier injection layer, a second carrier injection layer, a first carrier transporting layer, a second carrier transporting layer, a second carrier blocking layer, or a first carrier blocking layer.

7. A tunable organic light emitting device adjustable to alter a color of light emitted comprising:
 a first conductive layer having p-conductivity;
 a hole transporting layer supported on the first conductive layer;
 a first emissive layer of electron transporting material, designed to emit light of a first color when a recombination zone for hole-electron recombinations is positioned therein, the first emissive layer of electron transporting material being positioned on the hole transporting layer;
 a second emissive layer of electron transporting material, designed to emit light of a second color different than the first color, when the recombination zone for hole-electron recombinations is positioned therein, the second emissive layer of electron transporting material being positioned on the first emissive layer of electron transporting material;
 a second conductive layer having n-conductivity supported on the second emissive layer of electron transporting material; and
 a source of current coupled to the first and the second conductive layers to change position of the recombination zone for hole-electron recombinations from the first emissive layer of electron transporting material to the second emissive layer of electron transporting material, whereby one of the first color is emitted from the first layer or the second color is emitted from the second layer.

8. A tunable organic light emitting device adjustable to alter a color of light emitted comprising:
 a first conductive layer having p-conductivity;
 a hole transporting layer supported on the first conductive layer;
 a first emissive layer of electron transporting material, with first fluorescent dye molecules as fluorescent centers distributed therein, the first emissive layer emitting light of a first color when a recombination zone for hole-electron recombinations is positioned therein, the first emissive layer of electron transporting material being positioned on the hole transporting layer;
 a second emissive layer of electron transporting material, with second fluorescent dye molecules as fluorescent centers distributed therein, the second emissive layer emitting light of a second color different than the first color when the recombination zone for hole-electron recombinations is positioned therein, the second emissive layer of electron transporting material being positioned on the first emissive layer of electron transporting material;
 a second conductive layer having n-conductivity supported on the layer of electron transporting material; and
 a source of current coupled to the first and the second conductive layers to change position of the recombination zone for hole-electron recombinations from the first emissive layer of electron transporting material to the second emissive layer of electron transporting material, whereby one of the first color is emitted from the first layer or the second color is emitted from the second layer.

9. An organic light emitting device as claimed in claim 8 wherein the first fluorescent dye molecules emit light of a first color upon recombination of holes and electrons in the first emissive layer and the second fluorescent dye molecules emit light of a second color, different than the first color, upon recombination of holes and electrons in the second emissive layer.

10. A method of energizing an organic light emitting device to emit different colors comprising the steps of:
 providing an organic light emitting device including a first conductive layer, a first layer of light emissive material designed to emit light of a first color, positioned adjacent the first conductive layer, a second layer of light emissive material designed to emit light of a second color, different than the first color, positioned on the first layer of emissive material, and a second conductive layer positioned adjacent the second layer of emissive material; and
 connecting opposite terminals of a power source to the first conductive layer and the second conductive layer, respectively, causing a first current flow through the first and second layers of emissive material such that the first layer of light emissive material is activated to emit light of the first color, and causing a second current flow, different than the first current flow, through the first and second layers of emissive material such that the second layer of light emissive material is activated to emit light of the second color.

11. A method of energizing an organic light emitting device to emit different colors as claimed in claim 10 wherein the step of causing the first current flow includes causing a first current density and the step of causing the second current flow includes causing a second current density higher than the first current density.

12. A method of energizing an organic light emitting device to emit different colors comprising the steps of:
 providing an organic light emitting device including a first conductive layer having p-conductivity, a hole transporting layer supported on the first conductive layer, a first emissive layer of electron transporting material positioned on the hole transporting layer, the first emissive layer including first fluorescent dye molecules distributed therein for emitting light of a first color when activated, a second emissive layer of electron transporting material positioned on the first emissive layer of electron transporting material, the second emissive layer including second fluorescent dye molecules distributed therein for emitting light of a second color, different than the first color, when activated, and a second conductive layer having n-conductivity supported on the layer of electron transporting material; and connecting opposite terminals of a power source to the first conductive layer and the second conductive layer, respectively, causing a first current flow through the hole transporting layer and the first and second layers of emissive material such that the first fluorescent dye molecules in the first layer of emissive material are activated to emit light of the first color, and causing a second current flow, different than the first current flow, through the hole transporting layer and the first and second layers of emissive material such that the second fluorescent dye molecules in the second layer of emissive material are activated to emit light of the second color.

* * * * *